United States Patent
Lecordier et al.

(10) Patent No.: US 10,959,338 B2
(45) Date of Patent: Mar. 23, 2021

(54) ATTACHING AN SMD TO AN INSULATING LAYER WITH A SOLDER JOINT IN A CAVITY FORMED IN AN INSULATING LAYER

(71) Applicant: SAFRAN ELECTRONICS & DEFENSE, Boulogne-Billancourt (FR)

(72) Inventors: Denis Lecordier, Boulogne-Billancourt (FR); Philippe Chocteau, Boulogne-Billancourt (FR); Jacky Jouan, Boulogne-Billancourt (FR)

(73) Assignee: SAFRAN ELECTRONICS & DEFENSE, Boulogne-Billancourt (FR)

( * ) Notice: Subject to any disclaimer, the term of this patent is extended or adjusted under 35 U.S.C. 154(b) by 0 days.

(21) Appl. No.: 16/630,268

(22) PCT Filed: Jul. 13, 2018

(86) PCT No.: PCT/EP2018/069149
§ 371 (c)(1),
(2) Date: Jan. 10, 2020

(87) PCT Pub. No.: WO2019/012136
PCT Pub. Date: Jan. 17, 2019

(65) Prior Publication Data
US 2020/0214142 A1 Jul. 2, 2020

(30) Foreign Application Priority Data
Jul. 13, 2017 (FR) .................................... 17 56700

(51) Int. Cl.
*B23K 3/00* (2006.01)
*H05K 3/00* (2006.01)
(Continued)

(52) U.S. Cl.
CPC ......... *H05K 3/3452* (2013.01); *B23K 3/0607* (2013.01); *H05K 3/1216* (2013.01); *B23K 2101/40* (2018.08); *H05K 2203/043* (2013.01)

(58) Field of Classification Search
CPC ....... H01L 2924/00014; H01L 2924/00; H01L 2224/32225; H01L 2224/48227;
(Continued)

(56) References Cited

U.S. PATENT DOCUMENTS 9,978,723 B2 * 5/2018 Takazawa ........... H01L 25/0657
9,991,195 B2 * 6/2018 Takeda ................ H01L 23/3128
(Continued)

FOREIGN PATENT DOCUMENTS

| DE | 42 43 356 A1 | 6/1994 |
|---|---|---|
| JP | 11-204928 A | 7/1999 |
| KR | 10-2011-0035176 A | 4/2011 |

OTHER PUBLICATIONS

International Search Report for PCT/EP2018/069149, dated Oct. 8, 2018.
(Continued)

*Primary Examiner* — Erin B Saad
(74) *Attorney, Agent, or Firm* — Sughrue Mion, PLLC (57) ABSTRACT

The invention relates to a method (S) for attaching an SMD to a printed circuit (10), comprising the following steps:
—applying an insulating layer (20) (S1) onto the printed circuit (10), —forming a cavity (22) in the insulating layer (20) above the conductive layer (12) (S2) of the printed circuit, —filling the cavity (22) with a solder paste (3), —positioning the SMD over the cavity (22) (S4), and —applying a heat treatment (S5) to the printed circuit (10).

9 Claims, 4 Drawing Sheets

(51) Int. Cl.
  *H05K 3/34*  (2006.01)
  *B23K 3/06*  (2006.01)
  *H05K 3/12*  (2006.01)
  *B23K 101/40*  (2006.01)

(58) Field of Classification Search
  CPC . H01L 2224/73265; H01L 2924/15311; H01L 2224/16225; H01L 2224/73204; H01L 2924/00012; H01L 2924/14; H01L 2224/05599; H01L 2924/00013; H01L 2924/181; H01L 2224/48091; H05K 2203/043; H05K 3/3452; H05K 3/3436; H05K 3/3478; H05K 3/3485; H05K 2201/10734; H05K 2203/041; H05K 2203/0557; H05K 2203/0577; B23K 3/0623; B23K 2101/42; B23K 2101/40; B23K 35/3613; B23K 3/0607
  See application file for complete search history.

(56) References Cited

U.S. PATENT DOCUMENTS

| | | | |
|---|---|---|---|
| 2002/0046627 A1* | 4/2002 | Amita | B23K 35/025 75/252 |
| 2004/0011855 A1* | 1/2004 | Nakamura | H05K 3/462 228/175 |
| 2007/0086147 A1* | 4/2007 | Kawamura | H01L 23/49811 361/600 |
| 2007/0145104 A1* | 6/2007 | Pang | H05K 3/3485 228/180.22 |
| 2008/0149369 A1* | 6/2008 | Kawamura | H05K 3/3452 174/251 |

OTHER PUBLICATIONS

Search Report dated Mar. 21, 2018 from the French Patent Office in application No. 1756700.
Written Opinion of the International Searching Authority dated Oct. 8, 2018 in application No. PCT/EP2018/069149.

* cited by examiner

ATTACHING AN SMD TO AN INSULATING LAYER WITH A SOLDER JOINT IN A CAVITY FORMED IN AN INSULATING LAYER

CROSS REFERENCE TO RELATED APPLICATIONS

This application is a National Stage of International Application No. PCT/EP2018/069149 filed Jul. 13, 2018, claiming priority based on French Patent Application No. 1756700 filed Jul. 13, 2017, the entire contents of each of which are herein incorporated by reference in their entireties.

FIELD OF THE INVENTION

The invention relates to the field of circuit boards, notably in the field of aeronautics and space, and more precisely to the attachment of surface mount components on printed circuits.

TECHNOLOGICAL BACKGROUND

In a manner known per se, a circuit board can comprise surface mount devices (SMDs), i.e. electronic components soldered directly to the surface of a printed circuit board.

Usually, SMDs are soldered on the surface either by reflow soldering or wave soldering.

In the case of reflow soldering, the bare printed circuit board is first screenprinted by covering the conductive layers of the printed circuit board (usually copper) with a solder paste using a screenprinting screen (or stencil) so that only the locations intended to receive the component terminations are covered by the solder paste. Solder paste comprises, in a manner known per se, a metal alloy suspended in a soldering flux. Then, the terminations of the components (SMDs) are placed on the solder paste before undergoing a reflow heat treatment, in which heat causes the alloy to reflow and the soldering flux to evaporate to form solder joints from the metal alloy present in the solder paste.

The reliability and service life of solder joints that attach SMDs to the printed circuit board depend on the vertical height (standoff) between the top of the copper solder layer and the lowest point of the conductive terminations of the SMDs once soldered. The standoff therefore corresponds to the alloy height at the interface between the SMD and the copper layer. Indeed, in use, the SMD and the surface on which it is soldered expand differently, causing relative displacements especially in the plane of the surface (X, Y). Thus, the larger the standoff, the softer and therefore stronger the solder joint.

However, the increase in the standoff is limited by the usual means of assembly available in production and by the diversity of geometries of the component housings to be surface soldered.

It was therefore proposed to place a wedge under the SMD to increase the standoff. However, the SMD can be damaged if it expands in a Z-shape (i.e. in a direction normal to the surface of the printed circuit board on which the SMD is soldered) and detaches prematurely from the printed circuit board. Furthermore, this solution is not applicable to all types of SMDs, regardless of their size, weight and the type of termination they carry.

It was also proposed to increase the amount of solder paste applied to the layers of the printed circuit board. For this purpose, the size (width) of the holes in the screenprinting screen can be increased, for example, so that the height of the solder joint is increased during the reflow step due to the coalescence effect: the thickness of the solder joint is greater than the equivalent alloy thickness obtained after reflow with smaller holes in the screenprinting screen, since the metal alloy cannot spread out beyond the layers of the printed circuit board due to the effect of wettability in its liquid phase (liquidus) during reflow. This method effectively increases the standoff. However, this remains limited by the volume of solder paste that can be introduced into the screen openings for demoulding and to limit the coalescence of the solder paste without generating microbeads.

In addition, the height of the solder paste deposited on the printed circuit board for soldering several SMDs is substantially the same for each SMD, since it is deposited by screen printing using a screen. Certainly, there are screens with variable thickness in order to locally increase the height of the screen openings, and thus the quantity of solder paste deposited. However, these variable thicknesses often involve screen printing problems for adjacent SMDs (unsatisfactory solder paste height in adjacent holes) and make it difficult to optimize the SMD layout in the circuit board.

Finally, depositing the solder paste by screen printing limits the implantation density of the electronic components on the printed circuit board and/or the type of component that can be used, especially in the case of fine pitch components. The size of the windows of the screenprinting screen is limited by the following condition so that the screen can be unmoulded without damaging the solder paste that has been deposited: the ratio between the surface of the window (in the plane of the screen, which is parallel to the plane (X, Y)) and the surface of the inner walls of the window (which extend perpendicularly to the plane of the screen) must be greater than or equal to 0.66. In order to respect such a ratio, it is therefore necessary to reduce the thickness of the screen, which necessarily implies reducing the height of the solder paste applied to the connecting surface and therefore reducing the standoff of the SMD and/or increasing the area of the window, which prevents the implantation of fine pitch SMDs.

SUMMARY OF THE INVENTION

An objective of the invention is therefore to propose a novel process for attaching a surface mount component to a printed circuit board which makes it possible to increase the service life of the component by increasing the associated standoff, which is in addition simple to carry out and of moderate cost whatever the density of implantation of the components on the printed circuit board and/or the type of component (and notably fine pitch components), without impacting the assembly efficiency of the circuit board.

For this purpose, the invention proposes a process for attaching an electronic component to a printed circuit, said printed circuit comprising a connecting surface comprising at least one conductive layer and defining an axis Z, said axis Z being normal to the connecting surface, the attachment process comprising the following steps:
applying an insulating layer comprising an electrically insulating material to the connecting surface of the printed circuit, the insulating layer having a predetermined minimum thickness along the axis Z,
forming a cavity in the insulating layer above the conductive layer so that at least part of the conductive layer is exposed, the cavity having a predetermined minimum depth along the axis Z, filling the cavity with a metal alloy accompanied by a soldering flux, position the electronic component over the cavity, applying a heat treatment to the printed circuit on which the component is placed in order to transform the metal alloy together with the soldering flux into a solder joint so as to attach the component to the printed circuit.

The minimum thickness of the insulating layer is such that the depth of the cavity is at least 100 µm.

Some preferred but not limiting features of the process described above are the following:

- the electrically insulating material of the insulating layer has a first coefficient of thermal expansion along the axis Z, the metal alloy has a second coefficient of thermal expansion along the axis Z, and wherein the first coefficient of thermal expansion is greater than the second coefficient of thermal expansion,
- the steps of applying the insulating layer and forming the cavity are carried out by surface photolithography,
- the cavity is made using at least one of the following techniques: laser drilling of the insulating layer, mechanical cutting of the insulating layer, chemical cutting of the insulating layer.
- the insulating layer is applied and attached to the connecting surface, and wherein the cavity is formed by cutting or drilling before or after attaching the insulating layer to the connecting surface,
- the insulating layer is formed by a printed circuit,
- the process further comprises, prior to the cavity filling step, a step of metallizing the conductive pad 12,
- the cavity is filled by screen printing, with or without a screenprinting screen,
- the cavity has a surface in a plane normal to the axis Z, said cavity being filled by screen printing with a screenprinting screen, said screen printing screen having a window with an area in the plane normal to the axis Z, the area of the window being at least equal to the area of the cavity, and/or
- the heat treatment includes reflow of the metal alloy.

BRIEF DESCRIPTION OF THE DRAWINGS

Other features, purposes and advantages of the present invention will become clearer by reading the detailed description which follows, in the light of the appending drawings, provided as nonlimiting examples, and wherein.

DETAILED DESCRIPTION OF AN EMBODIMENT

A circuit board 1 comprises a printed circuit 10, comprising a connecting surface 14 having at least one conductive layer 12, and at least one surface mount device (SMD 2), preferably several SMDs 2, soldered to the connecting surface 14.

The connecting surface 14 is substantially flat and defines a plane (X; Y), normal to an axis Z.

Figure 4:
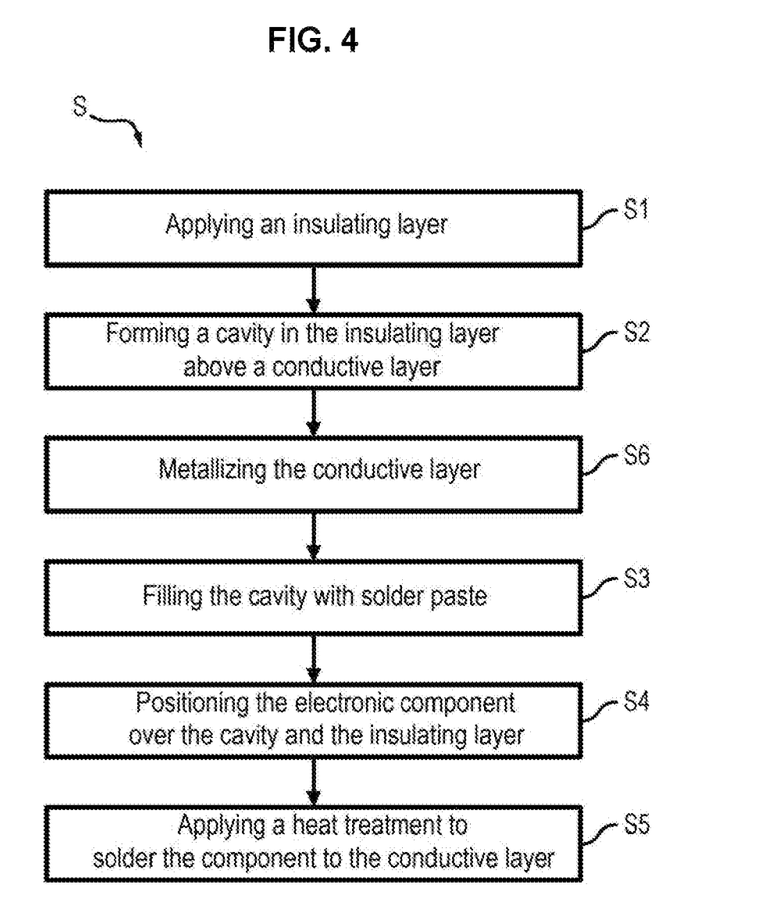
FIG. 4 is a flowchart illustrating an example of the steps for attaching an electronic component to a printed circuit board in accordance with an embodiment of the invention.

In accordance with the invention, the SMD 2 is attached in accordance with the following steps:

- applying an insulating layer 20 (step S1) comprising an electrically insulating material to the connecting surface 14 of the printed circuit 10,
- forming a cavity 22 (step S2) in the insulating layer 20 above the conductive layer 12 such that at least part of the conductive layer 12 is at least partially uncovered,
- filling the cavity 22 (step S3) with a metal alloy 4 accompanied by a soldering flux 5,
- positioning the component 2 over the cavity 22 (step S4),
- applying a heat treatment (step S5) to the printed circuit 10 on which the component is placed in order to transform the metal alloy 4 together with the soldering flux 5 into a solder joint 6 so as to attach the component to the printed circuit 10.

It will be noted that the insulating layer 20 has a determined minimum thickness T while the cavity 22 has a determined minimum depth d, where the thickness T and the depth d are dimensions along the axis Z. The minimum thickness T of the insulating layer 20 is then determined so that the depth d of the cavity 22 is at least 100 µm.

In general, the thickness T and the depth d can be substantially constant.

By virtue of the presence of the insulating layer 20, it is thus possible to obtain a higher standoff H than in the prior art as long as the standoff H obtained is at least equal to the depth d of the cavity 22, after the heat treatment. In addition, the minimum depth d of the cavity 22 in the insulating layer 20 increases the service life of solder joint 6 in a sufficient manner.

Furthermore, the order described above for steps S3 and S4 is not limiting. Typically, the SMD 2 can be placed over the cavity 22 before the cavity is filled, especially when the component is wave soldered.

Figure 1A:
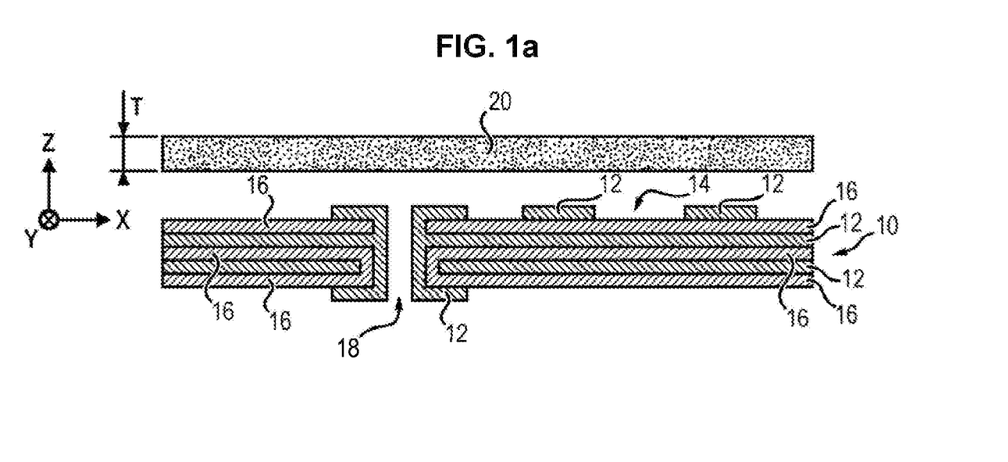
FIGS. 1a to 1g illustrate the steps in an exemplary embodiment of an attachment process in accordance with the invention.
Figure 1B:
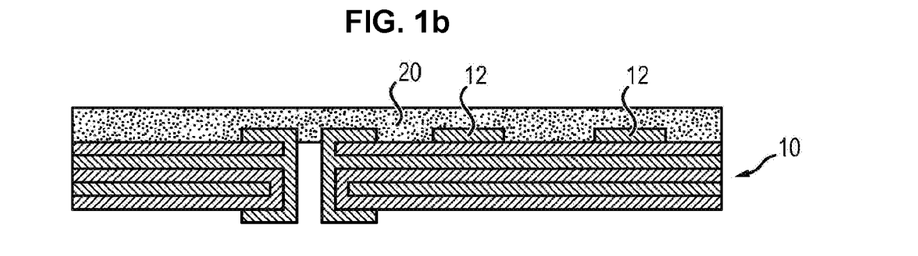
Figure 1C:
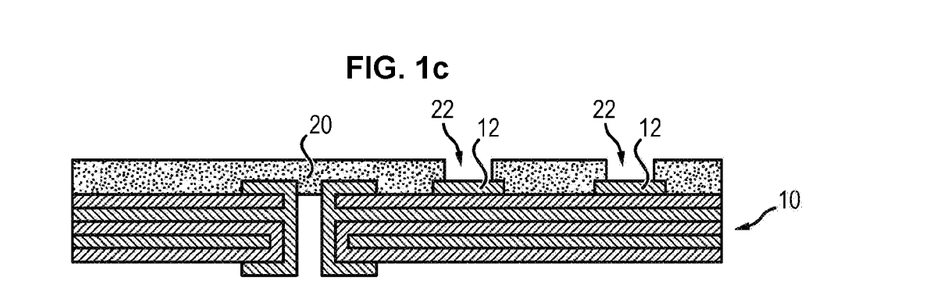
Figure 1D:
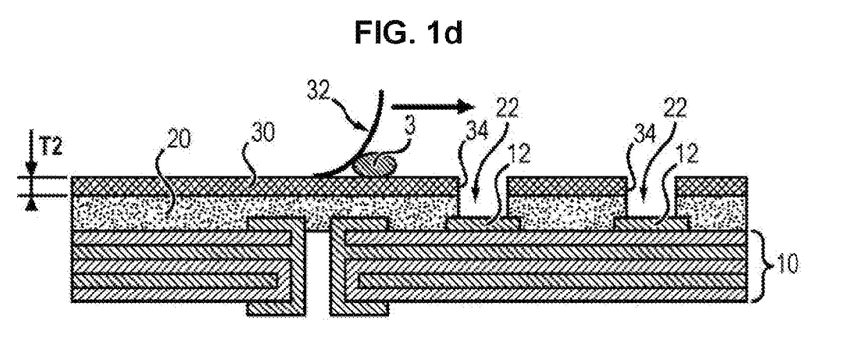
Figure 1E:
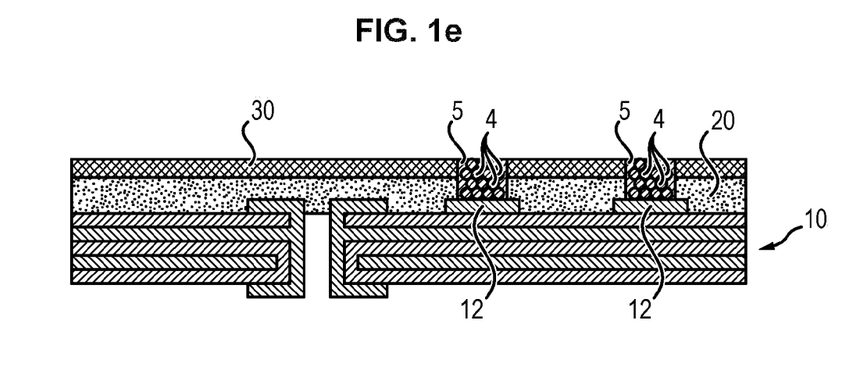
Figure 1F:
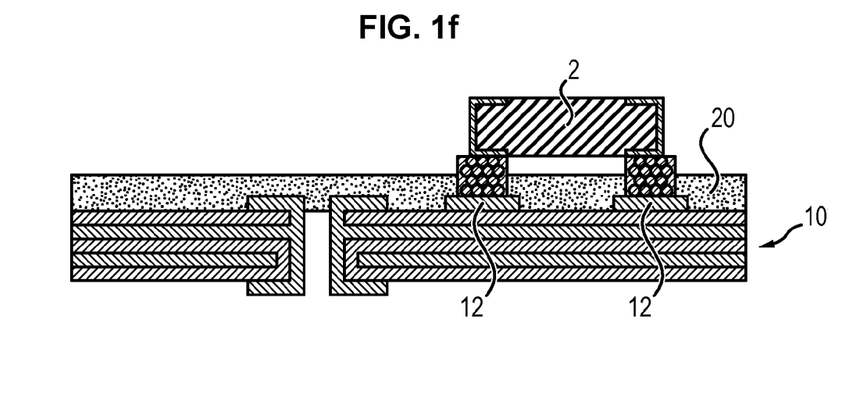
Figure 1G:
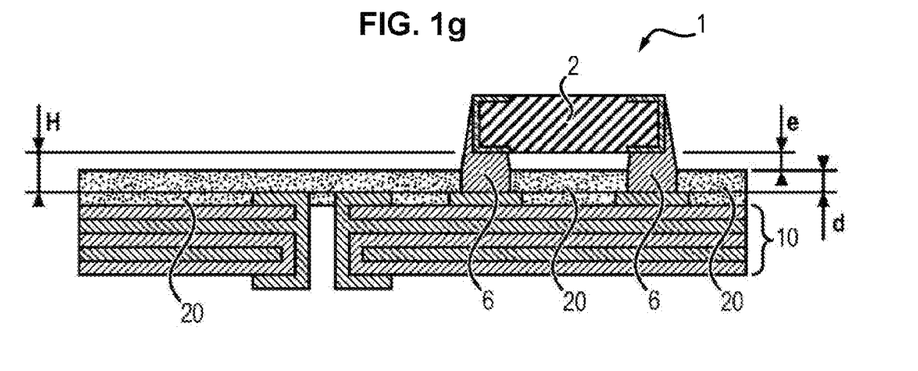

In one embodiment, the coefficient of thermal expansion along the axis Z of the material of the insulating layer 20 is greater than the coefficient of thermal expansion along the axis Z of the metal alloy 4 so that, after the heat treatment S5, after the solidification of the metal alloy 4, the insulating layer 20 shrinks more than the solder joint 6 (see FIG. 1g). The SMD 2 is therefore only supported by the solder joint 6 and a space e created between the bottom surface of the SMD 2 and the free surface of the insulating layer 20, thus eliminating the risk of contact between these two parts despite the possible differential expansion in Z of the SMD 2 and of the insulating layer 20. In addition, the height H of the solder joint 6 depends on the thickness T of the insulating layer 20 (here, the height H and the thickness T are defined in relation to the axis Z) and its coefficient of expansion in Z. As a result, it is possible to achieve an even higher standoff and a higher amount of the metal alloy 4 in the cavity 22, which further improves the service life of the component and the strength of the solder joint 6.

It will be noted that the operating temperature of the circuit boards 1 is necessarily lower than the melting point of the metal alloy 4, so that the SMD 2 is always at a distance from the insulating layer 20.

The thickness T of the insulating layer 20 is chosen so as to be large enough to guarantee a high standoff, even when the coefficient of thermal expansion along the axis Z of the material of the insulating layer 20 is not greater than that of the metal alloy 4, without penalizing the size and mass of the circuit board 1.

For example, the insulating layer 20 may have a thickness T defined so that the depth d (axis Z dimension) of the cavity 22, which corresponds to the distance between the exposed surface of the conductive layer 12 and the outer surface of the insulating layer 20, is at least 100 µm. Knowing that a conductive layer 12 usually has a thickness of about 17.5 µm to 35 µm and can then be recharged in a metallization step, which further increases its thickness by about 20 µm, a thickness T of the insulating layer of at least one hundred micrometres is then obtained. This thickness T can reach more than 300 µm depending on the desired service life (the thicker the layer, the longer the service life).

The insulating layer 20 can cover all or part of the connecting surface 14 of the printed circuit 10. In one embodiment, the insulating layer 20 covers the entire connecting surface 14.

The filling step S3 can be achieved for example by filling the cavity with a solder paste 3 comprising a metal alloy 4 suspended in a soldering flux 5. In step S4, the SMD 2 is then placed on the solder paste 3 above the insulating layer 20. Alternatively, step S3 can be achieved by soldering through a molten alloy bath, in which case the SMD 2 is placed on an adhesive spot (step S4) before the circuit board passes through the molten alloy bath.

Hereinbelow, the invention will be described in the case where the printed circuit 10 is single-layer (thus comprising a single connecting surface 14, a conductive layer 12 and an insulating layer 16 which may be of epoxy and glass fibre) and two cavities 22 are formed. In addition, the cavity filling S3 is achieved by introducing a solder paste 3 comprising a metal alloy 4 suspended in a soldering flux 5. However, this is not limiting, the number of cavities 22 made on the printed circuit 10 depending on the number and type of SMDs to be attached to its connecting surface 14 in order to make the circuit board 1. In addition, both surfaces of the printed circuit 10 could serve as connecting surface 14, while the circuit board 1 could include SMDs on each of these surfaces.

Optionally, the process S may further comprise, prior to the step S3 of filling the cavity 22, a metallization step S6 of the conductive pad 12 to facilitate the soldering of step S5.

The heat treatment S5 may notably comprise reflow soldering of the metal alloy 4 present in the solder paste 3. For this purpose, the temperature is gradually increased in a first step called "ramp up". This ramp-up step can, in a manner known per se, be carried out with a slope of between 1° C./s and 4° C./s up to 100° C. to 150° C. (maximum 7° C./s, maximum temperature slope recommended by the SMD components before soldering).

During a second "preheat" step, during which the drying of the fluxes ("soak" or "preflow") and the preparation for cleaning of the solder terminations of the printed circuit board and components take place, the temperature is gradually increased to about 170° C. and maintained for at least one and a half to several minutes (depending on the fluxes used) to allow the evaporation of the volatile parts of the soldering flux 5 and the temperature homogeneity of all components before the reflow phase. The insulation layer 20 expands.

In a third "reflow" step the temperature is increased again until a critical temperature is reached, usually 20 to 50° C. above the melting point of the metal alloy 4 used.

When the temperature passes through the melting point of the metal alloy 4 contained in the solder paste 3 (for example about 180° C. when the metal alloy 4 comprises a 63/37 tin/lead alloy, about 217° C. in the case of a 95.6/3.0/0.5 tin/silver/copper metal alloy 4 and about 221° C. in the case of a 96.5/3.5 tin/silver metal alloy 4), the metal alloy 4 melts.

During this step, the insulating layer 20 continues to expand, further lifting the SMD 2 relative to the connecting surface 14. It should be noted that at all times the liquid metal alloy 4 remains in contact with the SMD 2 terminals and the conductive layer 12 due to the effect of wettability.

Preferably, the increase in temperature during the reflow step is fast and in any case faster than the ramp-up step in order to avoid the SMD 2 being subjected to high temperatures for a long time. The printed circuit 10 may also be kept at the critical temperature above the melting point of the alloy for a period of time which may be between twenty and ninety seconds, depending on the thermal mass of the components to be assembled. This time above the melting point of the alloy allows the creation of the intermetallics which will ensure the maintenance of the components between the metal alloy 4 and the parts to be assembled.

In a fourth step, the printed circuit 10 is cooled down quickly to room temperature. When the temperature passes through the melting point again and becomes lower than the melting point of the metal alloy 4, the metal alloy 4 solidifies, forming the solder joint 6. The layer 20 then guarantees a minimum component height H. When the coefficient of thermal expansion in Z of the insulating layer 20 is greater than that of the metal alloy 4, the insulating layer 20 undergoes a shrinkage which is greater than that of the metal alloy 4, thereby creating the space e between the lower surface of the SMD 2 and the free surface of the insulating layer 20. Alternatively, when the coefficient of thermal expansion in Z of the insulating material of the insulating layer 20 is not greater than that of the metal alloy 4, the lower surface of the SMD 2 rests on the insulating layer 20.

It will be noted that the soldering flux 5 will gradually evaporate during the ramp-up (and preheating/drying) step, leaving only the metal alloy 4 on the conductive layer 12. The solder joint 6 therefore includes only the metal alloy 4.

The reflow heat treatment is well known in the technical field of SMD 2 soldering, so it is not necessary to go into further detail here. In addition, the temperatures, slopes and times of the individual steps of the heat treatment S5 are given here by way of example and of course depend on the solder paste 3 used. A skilled person will therefore know how to adapt them without difficulty according to the type of metal alloy 4 and soldering flux 5 used.

The insulating layer 20 may notably include any electrically insulating material. If need be, the material making up the insulating layer 20 may be thermally conductive. Furthermore, depending on the thermal and vibration environment and in order to further increase the service life of the printed circuit 10, the material of the insulating layer 20 can, as was seen above, be chosen to have a higher coefficient of thermal expansion in Z than that of the metal alloy 4.

Typically, the insulating layer 20 can include at least one of the following materials: glass fibre, epoxy resin, polyimide, polyester, polymer, Teflon.

As can be seen, the process of the invention S allows the use of any type of solder paste 3, and in particular leadfree solder pastes, thus making it possible to comply with current standards and in particular with the European RoHS Directive No. 2002/95/EC—banning lead, hexavalent chromium, mercury, cadmium, polybromobiphenyl and decabromodiphenyl ethers. For example, the metal alloy 4 of the solder paste 3 may comprise one of the following compositions, which are most commonly used: 63/37 or 10/90 or 90/10 tin/lead, 62/36/2 tin/lead/silver, for products exempted from the RoHS Directive, or 96.5/3.5 tin/silver alloys, 96.5/3.8/

0.7 or 96.6/3.0/0.5 or 98.5/1.0/0.5 tin/silver/copper. This technique is suitable for all types of alloys (including bismuth, antimony, etc.).

In a manner known per se, the soldering flux 5 depends on the type of the metal alloy 4 suspended in the solder paste 3 and the assembly process with or without cleaning. The soldering flux 5 typically consists of a resin (typically a natural, modified or synthetic resin), activators and additives to optimize screen printing and reflow. The role of the soldering flux 5 is to strip the conductive layers 12 (using activators), protect them during the ramp-up steps and act as a surfactant to promote wetting of the metal alloy 4.

For example, the soldering flux 5 may include rosin.

The insulating layer 20 can be applied by any means to the connecting surface 14.

In a first embodiment, the insulating layer 20 can be applied by surface photolithography. In this case, the cavities 22 can also be formed by surface photolithography (see FIG. 2).

For this purpose, in a first step, a photoresist for forming the insulating layer 20 is applied to the connecting surface 14 in the form of a film. The resin can be a negative resin (ultraviolet radiation causes polymerization of the exposed areas, giving these areas a particular resistance to the developing solvent, while the noninsolated parts selectively disappear in this solvent) or a positive resin (ultraviolet radiation causes the macromolecules to break down, resulting in increased solubility of the exposed areas in the developing solvent). The resin may include an epoxy resin.

In a second step, a mask is applied to the resin film. The mask includes transparent and opaque areas to form the cavities 22 and the insulating layer 20.

In a third step, the resin film is exposed to light radiation: in the case of a positive resin (typically epoxy resin), the parts of the film present under the transparent areas will then react to this light radiation and solubilize, while the parts present under the opaque areas will be protected from it. Conversely, in the case of a negative resin, the cavities 22 are formed under the opaque areas of the film.

In all cases, the solubilized parts are then removed with a developing solvent, resulting in the insulating layer 20 in which the cavities 22 are formed.

As these steps are known per se, they will not be further detailed here.

In a second embodiment, the insulating layer 20 can be applied and attached to the connecting surface 14, for example by lamination or gluing with an adhesive layer (see FIGS. 1a and 1b). The adhesive layer can include any type of adhesive material conventionally used in the printed circuit board industry to bond layers together, typically an epoxy adhesive.

The cavities 22 can then be preformed in the insulating layer 20 before it is placed on the connecting surface 14, or after it has been attached (as in FIG. 1c for example).

For example, the cavities 22 can be formed by cutting out insulating layer 20. Cutting can be done mechanically (using a cutting tool such as mechanical milling or mechanical drilling or laser drilling before placing on the surface 14). In the case of application on the surface 14 before the cavities are made, the cutting can be done by chemistry on dry or liquid photoimageable films or by mechanical milling or laser drilling. Laser drilling can only be carried out if the surface (in the plane (X, Y)) at the bottom of the cavity 22 is smaller than the conductive copper layer 12, so that the copper layer extends beyond the bottom of the cavity 22 to allow the $CO_2$ laser to stop its action on the copper at depth.

When the cavities 22 are made by laser drilling of the insulating layer 20, the laser can be of the gas laser (carbon dioxide) type. The parameters chosen for the laser can then be similar to those usually used for the realization of laser vias.

The technique for laser drilling of the insulating layer 20 allows the cavities 22 to be formed with high precision. In particular, it is possible to position the cavities 22 with a high degree of accuracy in relation to the conductive layer 12 and to produce the cavities with small dimensional tolerances. Typically, the dimensional tolerance is around 25 microns (for cavities with a minimum side of 100 µm) when the cavities 22 are made by laser drilling, as opposed to around 100 microns (for cavities with a minimum side of 300 µm) when they are made by cutting (mechanical or chemical).

Laser drilling thus allows an increase in the density of the SMDs 2 on the connecting surface 14, since the size of the cavities 22 can be reduced (dimensional tolerances being smaller).

If the insulating layer 20 includes a printed circuit board, this can be applied and attached to the connecting surface 14 by soldering or gluing. In one embodiment, the cavities 22 are then made in the printed circuit board of the insulating layer.

The printed circuit board forming the insulating layer 20 can then extend over all or part of the connecting surface 14. Alternatively, it can be extended only locally, under the SMD.

This embodiment is of particular interest in the case where the SMD includes gull-winged legs, whose assembly tends to break.

The insulating layer 20 can be applied to the connecting surface 14 after the underlying layers of the printed circuit 10 have been produced. In this alternative embodiment, the printed circuit 10 is therefore supplied in a finished form (see appending FIG. 1a).

Alternatively (not shown in the figures), where the printed circuit board comprises at least four conductive layers 12, the insulating layer 20 may be applied to the connecting surface 14 of the printed circuit 10 when stacked, before the printed circuit 10 is laminated. Indeed, a printed circuit 10 is generally made by stacking and temperature compression in accordance with the following steps:

providing a double-sided printed circuit board (i.e. comprising an insulating layer 16 and two conductive layers 12 on either side of the insulating layer), applying and attaching an additional insulating layer to each conductive layer, the additional insulating layers which may include epoxy and glass fibres, for example, applying and attaching an outer conductive layer to each of the additional insulating layers, etching one of the outer conductive layers to form the pads of a connecting surface 14, applying and attaching an insulating layer 20 to the outer conductive layer forming the connecting surface 14, and compressing the assembly thus formed.

In this case, the insulating layer 20 is therefore attached before the compression step of the assembly (i.e. during stacking), by gluing or lamination on the connecting surface 14.

It will be noted that, whatever the embodiment, the printed circuit 10 may be of type single-layer (also called single-sided: the printed circuit comprises only a single conductive layer 12), double-layer (also called double-sided:

a conductive layer 12 on either side of an insulating layer 16) or multi-layer (at least four conductive layers 12).

In the exemplary embodiments shown in the figures, the printed circuit has, for example, four conductive layers 12. The connecting surface 14 of this printed circuit board comprises a conductive layer 12, on which two cavities 22 are formed for attaching an SMD. The printed circuit 10 further includes a through-hole 18. However, this is not restrictive, as the printed circuit 10 may include a larger or smaller number of conductive layers 12 as was just seen, a larger number of cavities on its connecting surface 14 and a different number (which may be equal to zero) of through or non-through holes.

The cavities 22 can be filled (step S3) by any suitable means.

The cavities 22 can be filled by any of the following methods, given here by way of nonlimiting example:
- by inkjet printing ("jetting") of the metal alloy 4 accompanied by a soldering flux 5,
- by passing through a turbulent wave of molten metal alloy 4 accompanied by a soldering flux 5.
- by dipping or passing through a bath of the metal alloy 4 in reflow before screen printing and SMD installation.
- on passing the board through a metal alloy bath 4 after placing the SMDs over the cavities 22 on at least one glue point during wave soldering. The use of a turbulent wave is advantageous due to the position of the copper 12 layers in the bottom of the cavities 22.

Alternatively, the cavities 22 can be filled by screen printing with a solder paste 3 comprising the metal alloy 4 together with a soldering flux 5, with or without a screen 30.

For example, the cavities 22 can be filled using, in a manner known per se, a screen 30 (or stencil). For this purpose, in a first step, a screen printing screen 30 in which two windows 34 have been formed is placed on the insulating layer 20. The screen 30 is positioned so that the windows 34 are opposite the cavities 22 to be filled.

Of course, the screen 30 can have a different number of windows 34 if a different number of cavities 22 have to be filled in the insulating layer 20.

Figure 2:
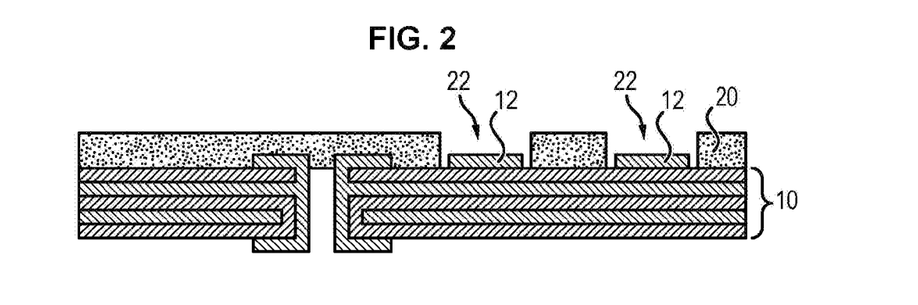
FIG. 2 shows an alternative embodiment of cavities formed in an insulating layer applied on a conductive layer of a printed circuit board.

The dimensions of the windows 34 are substantially equal to the dimensions of the associated cavities 22 to be filled in order to optimize the filling of the cavities 22. Preferably the dimensional accuracy for the realization of the windows 34 is of the order of thirty micrometres. The windows 34 may be slightly larger than the cavities 22 to ensure proper filling of the cavities and to increase the amount of solder paste 3 applied (FIG. 2).

In a second step as shown in FIG. 1d, the solder paste 3 is applied to the screen 30 and then forced into the windows 34 and into the cavities 22 using a squeegee 32. In a manner known per se, the squeegee 32 may comprise a metal sheet, which is inclined at an angle of between 45° and 60° to better push the solder paste 3 into the cavities 22.

In a third step, the screen 30 can be removed from the mould, leaving the solder paste in the cavities 22 (the thickness of the solder paste 3 applied is greater than the thickness T of the insulating layer 20, due to the presence of the screen).

Figure 3:
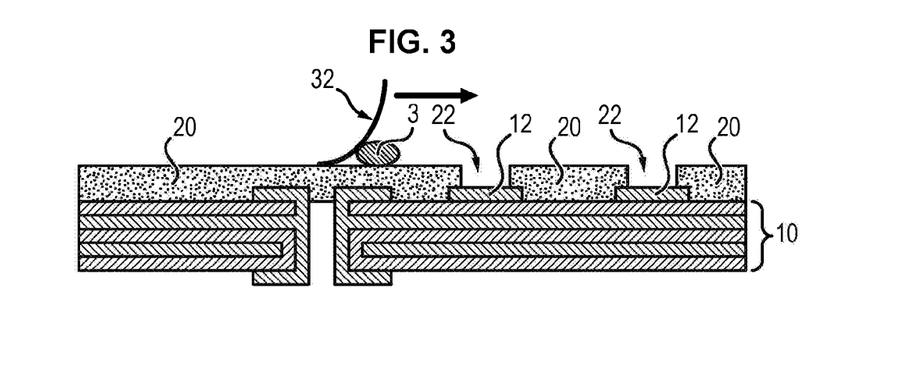
FIG. 3 shows a variant of the cavity filling step.

Alternatively, the cavities 22 can be filled by screen printing without using a screen 30. Indeed, the squeegee 32 can be applied directly to the insulating layer 20, which then serves as a screen 30 (see FIG. 3). When the squeegee 32 reaches the cavities 22, it then forces the solder paste 3 into the cavities 22 in a similar way to what is usually done with a screen 30. In order to avoid the presence of solder paste on top of the layer 20, it is preferable to use a polymer squeegee. The few remaining alloy balls can be washed out after the heat treatment step S5. After filling the cavities 22, the insulating layer 20 is not removed from the mould so that it can act as a support for the SMD 2 and as a holding agent for the solder paste 3 during the heat treatment.

This embodiment without screen 30 thus makes it possible to reduce the manufacturing costs of the circuit board 1 insofar as it is no longer necessary to make a screenprinting screen 30 and to use equipment requiring high precision (no more screen to be positioned face to face with the printed circuit 10). The step S4 of filling the cavities 22 is further facilitated since it is no longer necessary to precisely position a screen 30 on the insulating layer 20.

The dimensions of the cavities 22 are chosen so that each cavity 22 reveals at least part of the opposite conductive layer 12. For example, each cavity 22 can be sized to cover and overflow the conductive layer 12. The definition of the cavity dimensions depends on the SMD components to be assembled. For example, for size 0603 housings the cavities 22 can be of the order of 0.5 mm*1 mm; for size 1206 housings: 1 mm*2 mm; for size 2010 housings: 1.5 mm*4.5 mm. For fine pitch type housings the width of the cavity 22 could be for example 0.3 mm. The surface area of the bottom of the cavity 22 is therefore larger than the surface area it reveals of the conductive layer 12. This is not, however, limiting, as the cavities 22 can be sized so that they do not overflow the conductive layer 12.

The thicker the insulating layer 20, the greater the depth d of the cavities 22 and the greater the thickness of the solder paste 3 introduced into the cavities 22. If the cavities 22 are filled with the solder paste 3 by screen printing with a screen, the size of the windows of the screenprinting screen 30 is no longer limited by the possibility of demoulding the screen 30 after filling the cavities 22, since the insulating layer 20 remains on the connecting surface 14 and is no longer demoulded. Therefore, the height of solder paste 3 introduced into the cavities 22 is equal to the sum of the cavity depth d and the thickness T2 of the screen 30, the thickness T2 of the screen 30 may be small when the thickness T of the insulating layer 20 is large.

More precisely, as was seen above, the size of a window 34 of a screen 30 is limited by the ratio between the surface area of the window 34 (in the plane of the screen 30, which is parallel to the plane (X, Y)) and the surface area of the internal walls of the window 34 (which extend perpendicularly to the plane of the screen 30), which must be greater than or equal to 0.66. Until now, it was either necessary to reduce the thickness T2 of the screen 30, which implied a reduction in the amount of solder paste 3 and thus the standoff of the SMDs 2, or to increase the surface area of the window 34, which prevented the implantation of fine pitch SMDs 2 or limited the density of SMDs 2 implantable on the printed circuit 10.

The application of the insulating layer 20 on the connecting surface 14 thus makes it possible, in a highly advantageous manner, to remove this limitation as it becomes possible to drastically increase the height of the solder paste 3 applied to the printed circuit 10, without changing the thickness of the screenprinting screen 30. It is in fact sufficient to increase the thickness T of the insulating layer 20 as much as necessary and to make a window 34 with a surface adapted to the surface of the associated cavity 22, its thickness being dictated by the above ratio so that it remains greater than 0.66.

Thus, the invention makes it possible to overcome the difficulties of demoulding the screenprinting screen 30, when such a screen 30 is used, and makes it possible to implant fine pitch SMD 2 and/or a high density of SMD 2 on the circuit board 1. Typically, consideration can be given to using a screen 30 with a thickness of the order of 50 µm to 100 µm with local thicknesses of 100 µm to 300 µm possible if need be.

Of course, it will be understood that the removal of the screen-printing screen 30, made possible by the presence of the insulating layer 20, also makes it possible to implant fine pitch SMDs on the printed circuit board and/or to increase the density of SMDs on the connecting surface 14, since this process of filling the cavities 22 does not require a screen 30 to be removed from the mould.

The invention claimed is:

1. A process for attaching an electronic component to a printed circuit, said printed circuit comprising a connecting surface having at least one conductive layer and defining an axis Z, said axis Z being normal to the connecting surface, the attachment process comprising the following steps:
    applying an insulating layer comprising an electrically insulating material to the connecting surface of the printed circuit, the insulating layer having a minimum thickness determined along the axis Z,
    forming a cavity in the insulating layer above the conductive layer so that at least part of the conductive layer is exposed, the cavity having a minimum depth determined along the axis Z,
    filling the cavity with a metal alloy accompanied by a soldering flux,
    positioning the electronic component over the cavity,
    applying a heat treatment to the printed circuit on which the component is placed in order to transform the metal alloy together with the soldering flux into a solder joint so as to attach the component to the printed circuit,
    wherein the minimum thickness of the insulating layer is such that the depth of the cavity is at least equal to 100 µm, and
    wherein the electrically insulating material of the insulating layer has a first coefficient of thermal expansion along the axis Z, the metal alloy has a second coefficient of thermal expansion along the axis Z, and wherein the first coefficient of thermal expansion is greater than the second coefficient of thermal expansion.

2. The attachment process as claimed in claim 1, wherein the steps of applying the insulating layer and of forming the cavity are carried out by surface photolithography.

3. The attachment process 44 as claimed in claim 1, wherein the cavity is made using at least one of the following techniques:
    laser drilling of the insulating layer,
    mechanical cutting of the insulating layer,
    chemical cutting of the insulating layer.

4. The attachment process as claimed in claim 3, wherein the insulating layer is applied and attached to the connecting surface, and wherein the cavity is formed by cutting or drilling before or after the insulating layer is attached to the connecting surface.

5. The fabrication process as claimed in claim 3, wherein the insulating layer is formed by a printed circuit.

6. The fabrication process as claimed in claim 1, further comprising, prior to the step of filling the cavity, a step of metallizing the conductive pad.

7. The attachment process as claimed in claim 1, wherein the cavity is filled by screen printing, with or without a screen-printing screen.

8. The attachment process as claimed in claim 1, wherein the cavity has a surface in a plane normal to the axis Z, said cavity being filled by screen printing with a screen-printing screen, said screen-printing screen having a window with an area in the plane normal to the axis Z, the surface of the window being at least equal to the surface of the cavity.

9. The attachment process as claimed in claim 8, wherein the heat treatment comprises reflow of the metal alloy.

* * * * *